(12) United States Patent
Periaman et al.

(10) Patent No.: US 8,198,716 B2
(45) Date of Patent: Jun. 12, 2012

(54) DIE BACKSIDE WIRE BOND TECHNOLOGY FOR SINGLE OR STACKED DIE PACKAGE

(75) Inventors: Shanggar Periaman, Penang (MY); Kooi Chi Ooi, Penang (MY); Bok Eng Cheah, Penang (MY); Yen Hsiang Chew, Penang (MY)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 11/728,534

(22) Filed: Mar. 26, 2007

(65) Prior Publication Data

US 2008/0237310 A1    Oct. 2, 2008

(51) Int. Cl.
*H01L 23/48* (2006.01)
(52) U.S. Cl. .................. 257/686; 257/E21.597
(58) Field of Classification Search .............. 257/686, 257/E21.597
See application file for complete search history.

(56) References Cited

U.S. PATENT DOCUMENTS

| | | | |
|---|---|---|---|
| 5,902,118 A | 5/1999 | Hubner | |
| 5,973,396 A | 10/1999 | Farnworth | |
| 6,013,948 A | 1/2000 | Akram et al. | |
| 6,080,640 A | 6/2000 | Gardner et al. | |
| 6,383,837 B1 | 5/2002 | Tsunashima | |
| 6,682,955 B2 | 1/2004 | Cobbley et al. | |
| 7,000,684 B2 | 2/2006 | Kenny et al. | |
| 7,092,254 B1 | 8/2006 | Monsef et al. | |
| 7,129,567 B2 | 10/2006 | Kirby et al. | |
| 7,217,631 B2 | 5/2007 | Suga | |
| 7,230,334 B2 | 6/2007 | Andry et al. | |
| 7,279,795 B2 | 10/2007 | Periaman et al. | |
| 7,317,256 B2 | 1/2008 | Williams et al. | |
| 7,355,273 B2 * | 4/2008 | Jackson et al. | 257/686 |
| 7,400,033 B1 | 7/2008 | Cheah et al. | |
| 7,420,273 B2 * | 9/2008 | Liu et al. | 257/712 |
| 7,432,587 B2 | 10/2008 | Mastromatteo | |
| 7,525,186 B2 | 4/2009 | Kim et al. | |
| 7,692,278 B2 | 4/2010 | Periaman et al. | |
| 2001/0033030 A1 | 10/2001 | Leedy | |
| 2002/0074637 A1 | 6/2002 | McFarland | |
| 2005/0156320 A1 | 7/2005 | Mastromatteo | |
| 2007/0158807 A1 | 7/2007 | Lu et al. | |
| 2007/0210446 A1 | 9/2007 | Andry et al. | |
| 2007/0235882 A1 | 10/2007 | Sekiguchi et al. | |
| 2008/0079131 A1 | 4/2008 | Kim et al. | |
| 2008/0083977 A1 | 4/2008 | Haba et al. | |
| 2008/0150155 A1 | 6/2008 | Periaman et al. | |
| 2008/0157322 A1 | 7/2008 | Tang et al. | |
| 2008/0157350 A1 | 7/2008 | Cheah et al. | |
| 2008/0315388 A1 | 12/2008 | Periaman et al. | |
| 2008/0315421 A1 | 12/2008 | Periaman et al. | |

(Continued)

OTHER PUBLICATIONS

Cheah, Bok E., et al., "Die Backside Metallization and Surface Activated Bonding for Stacked Die Packages", U.S. Patent Application filed Jun. 19, 2007, assigned U.S. Appl. No. 11/820,454.

(Continued)

*Primary Examiner* — Victor A Mandala
*Assistant Examiner* — Krista Soderholm
(74) *Attorney, Agent, or Firm* — Caven & Aghevli LLC

(57) ABSTRACT

Methods and apparatus to provide die backside connections are described. In one embodiment, the backside of a die is metallized and coupled to another die or a substrate. Other embodiments are also described.

19 Claims, 4 Drawing Sheets

U.S. PATENT DOCUMENTS

| | | |
|---|---|---|
| 2009/0065951 A1 | 3/2009 | Cheah et al. |
| 2009/0125114 A1 | 5/2009 | May et al. |
| 2009/0127667 A1 | 5/2009 | Iwata |
| 2010/0013073 A1 | 1/2010 | Andry et al. |
| 2012/0003792 A1 | 1/2012 | Cheah et al. |

OTHER PUBLICATIONS

Cheah, Bok Eng et al., "Package on Package Design to Improve Functionality and Efficiency", US Patent Application filed Dec. 29, 2006 assigned U.S. Appl. No. 11/648,143.

"Office Action received for U.S. Appl. No. 11/820,454 mailed Oct. 3, 2008, 9 pages."

"Office Action received for U.S. Appl. No. 11/648,143 mailed Oct. 9, 2007, 9 pages."

"Office Action received for U.S. Appl. No. 11/820,454 mailed Apr. 23, 2009, 10 pages."

"Office Action received for U.S. Appl. No. 11/820,454 mailed Sep. 30, 2009, 10 pages."

Final Office Action received for U.S. Appl. No. 11/820,454, mailed on May 12, 2010, 12 pages.

Notice of Allowance received for U.S. Appl. No. 11/648,143, mailed on Apr. 4, 2008, 9 pages.

Office Action Received for U.S. Appl. No. 11/852,904, mailed on Jan. 20, 2011, 12 pages.

Office Action Received for U.S. Appl. No. 11/852,904, mailed on Jul. 22, 2010, 13 pages.

Office Action Received for U.S. Appl. No. 11/852,904, mailed on Jan. 4, 2010, 10 pages.

Office Action Received for U.S. Appl. No. 11/820,454, mailed on Jan. 19, 2011, 9 pages.

Notice of Allowance Received for U.S. Appl. No. 11/852,904, mailed on Jun. 14, 2011, 7 pages.

Notice of Allowance Received for U.S. Appl. No. 11/820,454, mailed on Oct. 7, 2011, 5 pages.

\* cited by examiner

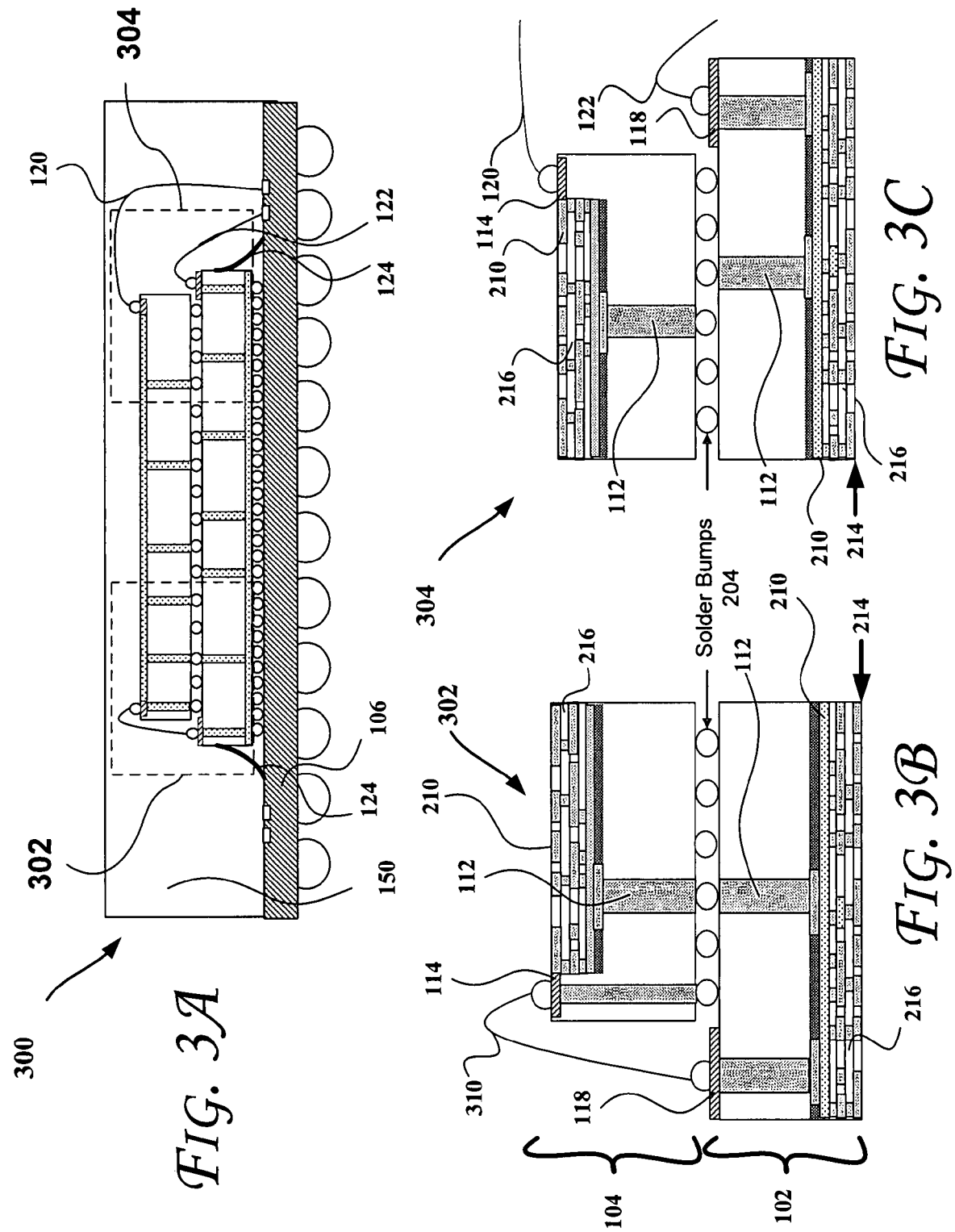

DIE BACKSIDE WIRE BOND TECHNOLOGY FOR SINGLE OR STACKED DIE PACKAGE

BACKGROUND

The present disclosure generally relates to the field of electronics. More particularly, an embodiment of the invention relates to die backside wire bond technology.

A computer system generally includes various components that may communicate with each other during operation of the computer system. Sometimes these components may be located on different dies. Hence, communication speed of these various dies may be paramount to the performance achieved by a computer system.

In some current computer systems, dies may interlink via relatively long traces, for example, through a computer system motherboard and various substrate levels. Long vertical paths may minimize the extension of current motherboard system architecture, introduce signal propagation delay, or generate additional heat. Some current computer systems aim to reduce the length of interlinks between various dies by stacked die technology and direct silicon via technology for direct die interlink. Utilization of direct silicon via technology for stacked dies may, however, require one die to carry the power source for another die. This approach may create thermal stress on the die that is responsible for carrying the power source. Also, one of the two dies in a stacked die design may receive minimal input/output (I/O) relative to the remaining die.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIGS. 1-3C illustrate various views of semiconductor devices according to some embodiments of the invention.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Some of the embodiments discussed herein (such as the embodiments discussed with reference to FIGS. 1-5) may utilize a die backside wire bond technology for single or stacked die packages. Such implementations may provide efficient mechanisms for transferring data and/or power signals to various dies, e.g., such as a "top" die in a stacked die package that is relatively further away from a package substrate. In an embodiment, a relatively shorter linkage between various dies such as active dies (including for example a central processing unit (CPU) die, chipset(s), network communication interfaces, and/or memory (such as flash memory)) may be provided to improve functionality and/or efficiency. Accordingly, in some embodiments, communication speed between various dies may be improved. Also, additional I/O and/or power supply signals may be provided in surface activated stacked die packages.

Figure 1:
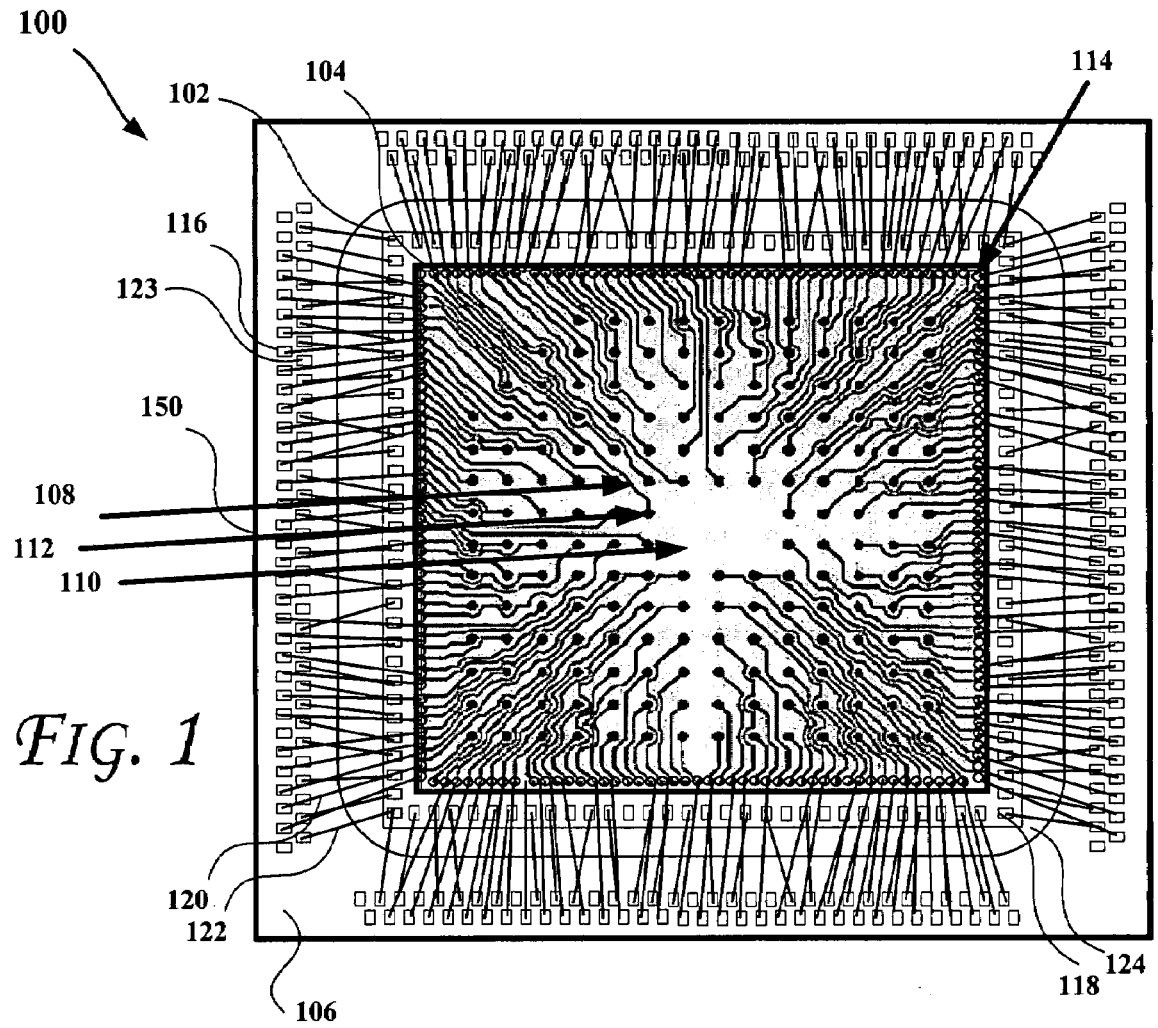

More particularly, FIG. 1 illustrates a top view of a stacked semiconductor package device 100 according to an embodiment of the invention. The package 100 may include one or more dies 102 and 104 that are stacked on a package substrate 106. In an embodiment, dies 102 and 104 may be coupled through surface activated bonding (SAB) such as the dies that will be discussed with reference to FIGS. 2A-2B. Generally, SAB method may be based on the strong adhesive force generated when two atomically clean surfaces come in contact. The active surface may be obtained by the dry etching processes performed in clean atmosphere, e.g., including high-vacuum condition such as fast atom beam bombardment, ion beam, and/or plasma irradiation. Also, more than two dies may be provided in the package 100 that may be coupled through surface activated bonding. Die 104 may include one or more die backside metal layers 108, passive layers 110, through silicon vias 112, and/or die backside wire bond metal pads 114. The die backside wire bond metal pads 114 may be coupled to pads 116 on the substrate 106 and/or pads on the die 102 such as pads 118 through wire bonds 120. Further, wire bonds 122 may couple the pads 118 to the substrate 106 via pads 123. In one embodiment, underfill 124 may be provided between the substrate 106 and die 102 (which may be constructed with material such as epoxy in an embodiment). Accordingly, the configuration shown in FIG. 1 may provide for an increased number of I/O and/or power supply couplings to die 104 through, for example, die backside wire bonds 120.

Figure 2A:
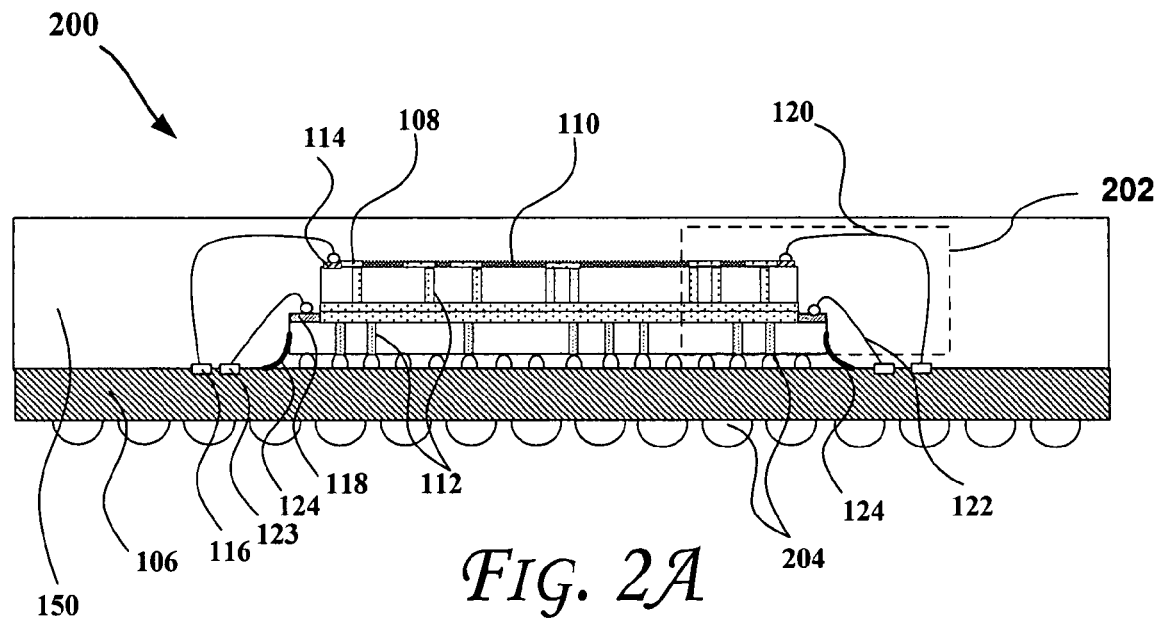

FIG. 2A illustrates a cross sectional side view of a semiconductor device 200 in accordance with an embodiment of the invention. The device 200 may include one or more of the substrate 106, wire bonds 120 and/or 122, die backside metal layers 108, and/or pads 114, 116, 118, and 123. Further details of a portion 202 of the device 200 will be discussed with reference to FIG. 2B. As shown in FIG. 2A, solder bumps 204 may couple various components of the device 200, such as die 102 and substrate 106, substrate 106 to other components such as a motherboard (not shown), etc.

Figure 2B:
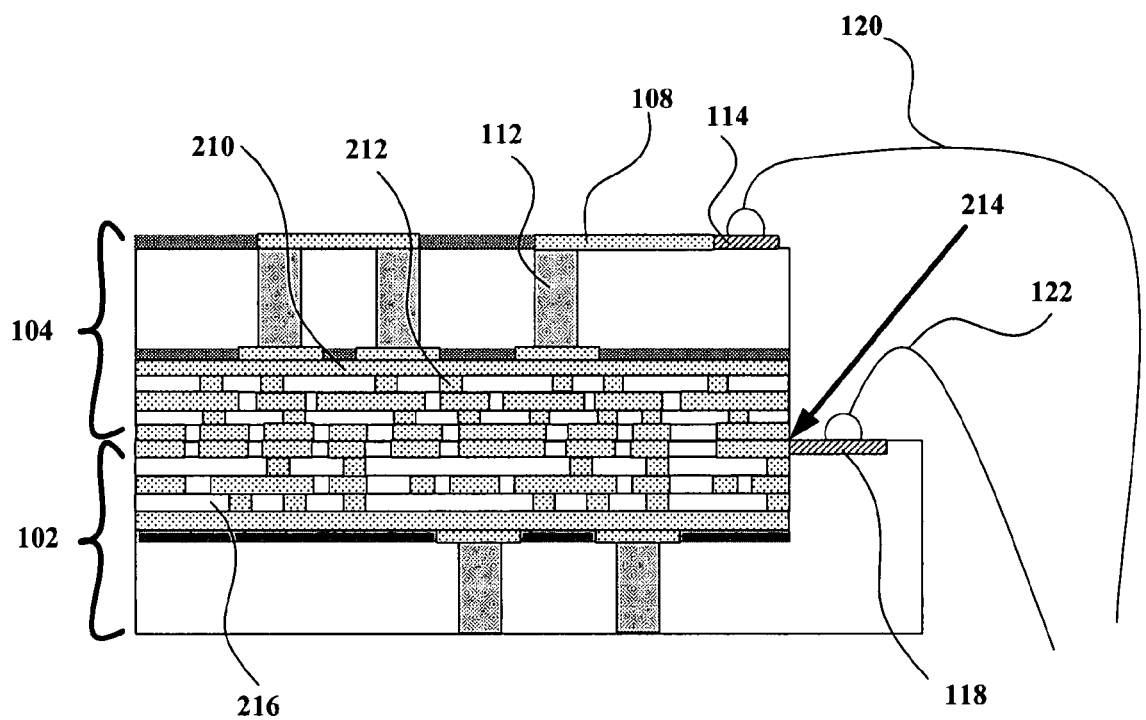

FIG. 2B illustrates a cross sectional side view of a portion of the semiconductor device 200 of FIG. 2A, according to an embodiment. The portion 202 shown in FIG. 2B may include one or more of the dies 102 and 104, pads 114 and 118, wire bonds 120 and 122, die backside metal layers 108, and/or vias 112. As shown in FIG. 2B, die 104 may include one or more of an active metal layer 210 and/or metal vias 212. Surface activated bonding (SAB) 214 may be used to couple dies 102 and 104 (which may be flipped). Also, as illustrated in FIG. 2B, dies 102 and 104 may include dielectric layers 216.

FIG. 3A illustrates a cross sectional side view of a semiconductor device 300 in accordance with an embodiment of the invention. The device 300 may include one or more of the substrate 106 and/or wire bonds 120 and/or 122. Further details of portions 302 and 304 of the device 300 will be discussed with reference to FIGS. 3B and 3C, respectively.

FIG. 3B illustrates a cross sectional side view of a portion of the semiconductor device 300 of FIG. 3A, according to an embodiment. The portion 302 shown in FIG. 3B may include one or more of the dies 102 and 104, pads 114 and 118, a wire bond 310 (that couples the dies 102 and 104 via pads 114 and 118, which may also couple to die active metal layers 108, vias 112 and/or solder bumps 204. As shown in FIG. 3B, die 102 and die 104 may include one or more of the active metal layer 210 and/or metal vias 212. Any electrical interconnection including but not limited to solder bumps and/or SAB (not shown) 214 may be used to couple the die 102 and substrate 106 in an embodiment. Also, as illustrated in FIG. 3B, dies 102 and 104 may include dielectric layers 216.

FIG. 3C illustrates a cross sectional side view of a portion of the semiconductor device 300 of FIG. 3A, according to an embodiment. The portion 304 shown in FIG. 3C may include one or more of the dies 102 and 104, pads 114 and 118, wire bonds 120 and 122, pads 114 and 118, which may also couple to die active metal layers 108, vias 112 and/or solder bumps 204. As shown in FIG. 3C, die 102 may include one or more of the active metal layer 210 and/or metal vias 112. Any electrical interconnection including but not limited to solder bumps and/or SAB (not shown) 214 may be used to couple the die 102 and substrate 106 in an embodiment. Also, as illustrated in FIG. 3C, dies 102 and 104 may include dielectric layers 216.

As shown in FIGS. 3A-3C, solder bumps 204 may couple various components of the device 300, such as dies 102 and 104, die 102 and substrate 106, substrate 106 to other components such as a motherboard (not shown), etc. Additionally, as shown in FIGS. 2A-3C, in accordance with some embodiments, the pads 114 and 118 may be staggered, e.g., to provide a better fit, increase wire bond density, etc. Furthermore, in some embodiments, molds 150 may be provided to mechanically couple various components of the devices 100, 200, and/or 300. Molds 150 may be constructed with material such as epoxy, epoxy with particles (such as silica particles), organic cylinders, plastic mold, plastic mold with particles/fiber, etc. Moreover, in some embodiments, vias 112 may be constructed with material such as aluminum, copper, silver, gold, combinations thereof, or other electrically conductive material. Moreover, each of the dies 102 and 104 may include circuitry corresponding to various components of a computing system, such as the components discussed with reference to FIG. 5.

Figure 4:
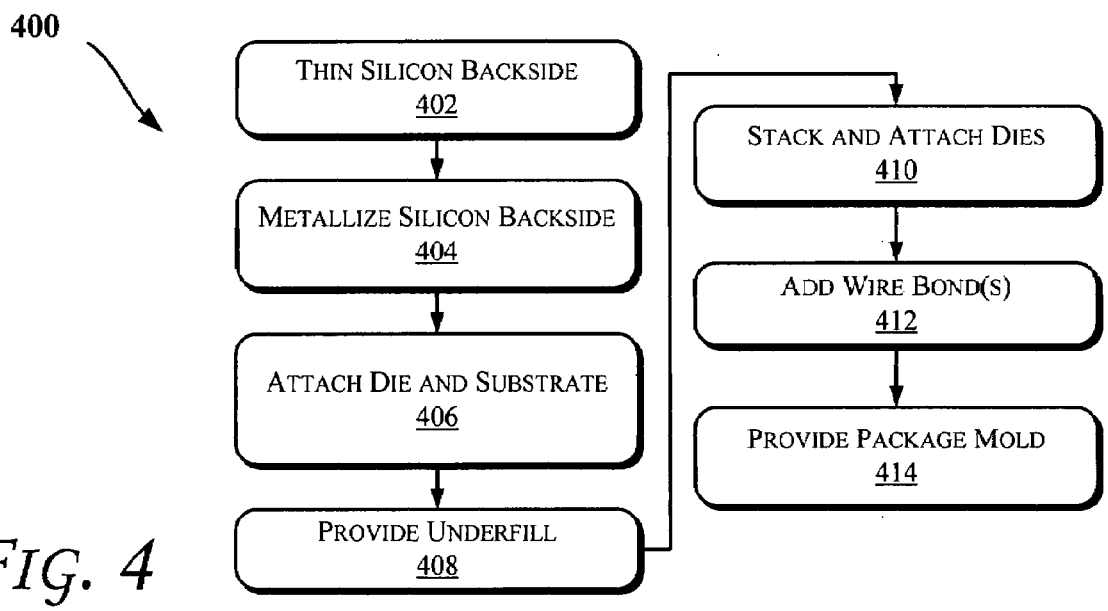
FIG. 4 illustrates a block diagram of a method according to an embodiment.

FIG. 4 illustrates a block diagram of an embodiment of a method 400 to provide a stacked die package. In an embodiment, various components discussed with reference to FIGS. 1-3C and 5 may be utilized to perform one or more of the operations discussed with reference to FIG. 4. For example, the method 400 may be used to provide the devices 100, 200, and/or 300, or one or more components of the system 500 of FIG. 5.

Referring to FIGS. 1-4, at an operation 402, backside of silicon may be thinned (e.g., backside of dies 102 and/or 104 may be thinned, for example, to improve heat dissipation). At an operation 404, the silicon backsides may be metallized (e.g., to introduce the metal layers 108). In some embodiments, at operation 404, dies 102 and/or 104 may be put through one or more of a Nitride layer coating process, passivation layer coating process, application of one or more photo resist layers (e.g., and removal of the passivation layer (e.g., via etching) in between application of the photo resist layers), removal of the Nitride layer (e.g., via etching), removal of the one or more photo resist layers, Copper layer surface coating process, and/or silicon backside grinding process.

At an operation 406, die and substrate may be attached, e.g., solder bumps may be attached (such as the bumps 204) to couple dies or other component of semiconductor device (e.g. dies 102 and substrate 106). At an operation 408, an underfill may be provided (e.g., such as the underfill 124). At an operation 410, dies may be stacked and attached (e.g., dies 102 and 104 may be stacked (with one being flipped in an embodiment, for example) and attached as discussed with reference to FIGS. 2A-3C). Any electrical interconnection including but not limited to surface activated bonding (SAB) and/or solder bump interconnection may be used to couple dies or other components of a semiconductor device (e.g., dies 102 and 104), At an operation 412, one or more wire bonds may be added (such as wire bonds 120, 122, and/or 310). At an operation 414, a package mold (such as the mold 150) may be provided. The order of operations 406-414 may be interchangeable.

In some embodiments, one or more of die backside metallization (DBM), and/or through silicon vias may provide relatively direct (e.g., shorter) die to die or die to substrate communication (such as discussed with reference to FIGS. 1-4). Such embodiments may improve communication speed and/or efficiency between components of a computing system (such as the components discussed with reference to FIG. 5). For example, input, power, and/or clock signals may be routed to the top and bottom dies simultaneously with minimal skew through die backside wire bonding (DB-WB) at SAB interface or solder bumps. Also, die backside metal routing (e.g., layers 108) may provide an interconnection between die backside wire bond pads (e.g., pads 114) and silicon via (e.g., vias 112). Additionally, the minimized vertical path in package and/or socket provided through the techniques discussed with reference to FIGS. 1-4 may allow for the extension of motherboard system architecture.

Moreover, some embodiments may: (a) allow for an increase in signal transmission frequency between integrated circuit (IC) chips and the package systems; (b) enable high density and fine pitch between chips even at sub-micron levels; (c) provide relatively minimal thermal mismatch between chips to reduce stacked die shear stress (which may also allow the interconnection height to be at the range of sub-micron level); (d) a staggered stacked die system between active logic (e.g., CPU or server with chipset and flash or network communication products) may reduce the interconnection delays between package and board; reduce substrate stress towards the active die metal layers; (e) ultra-low interconnect pitch would allow the metal layer to be build at a minimum (e.g., two to three layers) (which may reduce the fabrication process costs); and/or (f) enable the process to be performed between two solid contacts at room temperature (which may reduce thermal stress during bonding process).

Figure 5:
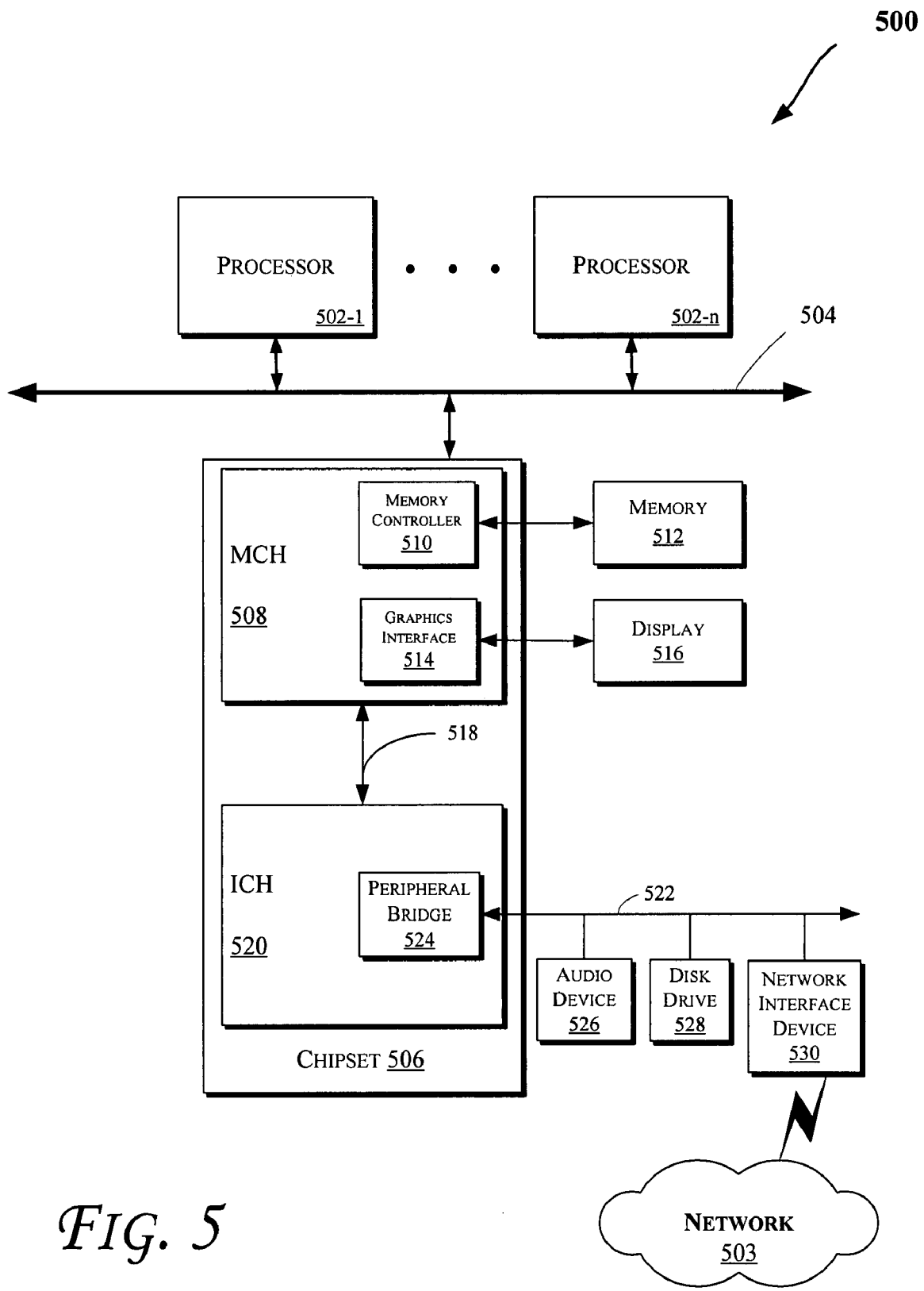
FIG. 5 illustrates a block diagram of a computing system, which may be utilized to implement various embodiments discussed herein.

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may include a general purpose processor, a network processor (that processes data communicated over a computer network 503), or other types of a processor (including a reduced instruction set computer (RISC) processor or a complex instruction set computer (CISC)). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors. Moreover, the operations discussed with reference to FIGS. 1-4 may be performed by one or more components of the system 500.

A chipset 506 may also communicate with the interconnection network 504. The chipset 506 may include a memory control hub (MCH) 508. The MCH 508 may include a memory controller 510 that communicates with a memory 512. The memory 512 may store data, including sequences of instructions that are executed by the CPU 502, or any other device included in the computing system 500. In one embodiment of the invention, the memory 512 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 504, such as multiple CPUs and/or multiple system memories.

The MCH 508 may also include a graphics interface 514 that communicates with a display 516. In one embodiment of the invention, the graphics interface 514 may communicate with the display 516 via an accelerated graphics port (AGP). In an embodiment of the invention, the display 516 may be a flat panel display that communicates with the graphics interface 514 through, for example, a signal converter that translates a digital representation of an image stored in a storage device such as video memory or system memory into display signals that are interpreted and displayed by the display 516. The display signals produced by the interface 514 may pass through various control devices before being interpreted by and subsequently displayed on the display 516.

A hub interface 518 may allow the MCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB) controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503). Other devices may communicate via the bus 522. Also, various components (such as the network interface device 530) may communicate with the MCH 508 in some embodiments of the invention. In addition, the processor 502 and the MCH 508 may be combined to form a single chip. Furthermore, the graphics accelerator 516 may be included within the MCH 508 in other embodiments of the invention.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions). In an embodiment, components of the system 500 may be arranged in a point-to-point (PtP) configuration. For example, processors, memory, and/or input/output devices may be interconnected by a number of point-to-point interfaces.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIG. 5.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:
1. An apparatus comprising:
a first die having a first set of one or more die backside wire bond pads, wherein at least one of the first set of one or more wire bond pads is coupled to a first end of a through silicon via (TSV) through a die backside metal layer; and
a second die coupled between the first die and a package substrate, the second die having a second set of one or more wire bond pads, wherein a second end of the through silicon via is to be coupled to an active metal layer of the second die and at least one of the second set of one or more wire bond pads, wherein one or more of a third set of wire bond pads on the package substrate are to be directly coupled to one or more of the first set of one or more die backside wire bond pads and one or more of the second set of one or more die backside wire bond pads.

2. The apparatus of claim 1, wherein the first die and the second die are coupled through a surface activated bonding layer.

3. The apparatus of claim 1, wherein the first die and the second die are coupled through one or more solder bumps.

4. The apparatus of claim 1, wherein the package substrate is coupled to the second die through a surface activated bonding layer.

5. The apparatus of claim 1, further comprising one or more wire bonds to couple one or more pads of the first set of pads, the second set of pads, or the third set of pads.

6. The apparatus of claim 1, further comprising a mold to mechanically couple one or more of the first die, the second die, or the substrate.

7. The apparatus of claim 1, wherein at least one of the first die or the second die comprises one or more of: a processor, a memory device, a network communication device, or a chipset.

8. The apparatus of claim 7, wherein the processor comprises one or more processor cores.

9. A method comprising:
 metallizing a backside of a first die;
 stacking the first die on a second die;
 coupling the metallized backside of the first die to one or more of a first set of wire bond pads on the first die;
 coupling a metallized layer of the second die to one or more of a second set of wire bond pads on the second die;
 directly coupling one or more of a third set of wire bond pads on a package substrate to one or more of the first set of wire bond pads on the first die and one or more of the second set of wire bond pads on the second die, wherein one or more through silicon vias are to electrically couple the metallized layer of the second die and the metallized backside of the first die.

10. The method of claim 9, further comprising flipping at least one of the first die or the second die.

11. The method of claim 9, further comprising providing a mold to mechanically couple the first die and the second die to a substrate.

12. The apparatus of claim 1, wherein backsides of the first die and the second die are to be thinned prior to metalizing the backsides of the first die and the second die.

13. The method of claim 9, further comprising thinning backsides of the first die and the second die prior to metalizing the backsides of the first die and the second die.

14. The method of claim 9, further comprising coupling a pair of the first, second, or third set of wire bond pads via a wire bond.

15. The method of claim 9, wherein at least one of the first die or the second die comprises one or more of: a processor, a memory device, a network communication device, or a chipset.

16. The method of claim 15, wherein the processor comprises one or more processor cores.

17. The method of claim 9, further comprising thinning backsides of the first die and the second die prior to providing under fill between the second die and the package substrate.

18. The method of claim 9, further comprising coupling the package substrate to the second die through a surface activated bonding layer.

19. The apparatus of claim 1, wherein backsides of the first die and the second die are to be thinned prior to provision of under fill between the second die and the package substrate.

* * * * *